United States Patent
Holland et al.

(10) Patent No.: US 11,342,485 B2
(45) Date of Patent: May 24, 2022

(54) OPTOELECTRONIC SEMICONDUCTOR COMPONENT, AND METHOD FOR PRODUCING AN OPTOELECTRONIC SEMICONDUCTOR COMPONENT

(71) Applicant: OSRAM OLED GmbH, Regensburg (DE)

(72) Inventors: Brendan Holland, Regensburg (DE); Markus Bröll, Cork (IE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/963,482

(22) PCT Filed: Jan. 24, 2019

(86) PCT No.: PCT/EP2019/051765
§ 371 (c)(1),
(2) Date: Jul. 20, 2020

(87) PCT Pub. No.: WO2019/145431
PCT Pub. Date: Aug. 1, 2019

(65) Prior Publication Data
US 2021/0050484 A1 Feb. 18, 2021

(30) Foreign Application Priority Data
Jan. 25, 2018 (DE) ................. 10 2018 101 700.6

(51) Int. Cl.
*H01L 33/46* (2010.01)
*H01L 31/0216* (2014.01)
*H01L 31/0232* (2014.01)

(52) U.S. Cl.
CPC ........ *H01L 33/46* (2013.01); *H01L 31/02161* (2013.01); *H01L 31/02327* (2013.01); *H01L 2933/0025* (2013.01)

(58) Field of Classification Search
CPC ... H01L 33/46; H01L 33/44; H01L 31/02161; H01L 31/02327; H01L 2933/0025
See application file for complete search history.

(56) References Cited

U.S. PATENT DOCUMENTS 10,283,676 B2  5/2019  Baur
2011/0207252 A1*  8/2011  Jeong ............... H01L 33/42
                                                              438/27

(Continued)

FOREIGN PATENT DOCUMENTS

CN    103700735 A  *  4/2014
DE    102015118041 A1     4/2017

(Continued)

*Primary Examiner* — Sitaramarao S Yechuri
(74) *Attorney, Agent, or Firm* — Slater Matsil, LLP

(57) ABSTRACT

An optoelectronic semiconductor component and a method for producing an optoelectronic semiconductor component are disclosed. In an embodiment an optoelectronic semiconductor component includes a semiconductor layer sequence having a first region of a first conductivity type, a reflection layer, a passivation layer arranged between the semiconductor layer sequence and the reflection layer, a first barrier layer arranged between the first region of the semiconductor layer sequence and the passivation layer and a second barrier layer arranged between the passivation layer and the reflection layer, wherein the first barrier layer is configured to reduce or prevent diffusion of contaminants from the passivation layer into the semiconductor layer sequence, and wherein the second barrier layer is configured to reduce or prevent diffusion of contaminants from the passivation layer into the reflection layer.

16 Claims, 2 Drawing Sheets

(56) References Cited

U.S. PATENT DOCUMENTS

| | | | | |
|---|---|---|---|---|
| 2012/0161176 A1* | 6/2012 | Heo | ........................ | H01L 33/46 |
| | | | | 257/98 |
| 2016/0260602 A1* | 9/2016 | Sreekala | ................. | C23C 16/24 |
| 2017/0130909 A1* | 5/2017 | Yeon | ...................... | H01L 33/50 |
| 2017/0221705 A1* | 8/2017 | Matsuo | ............... | H01L 21/0262 |
| 2018/0029931 A1* | 2/2018 | Schurmann | .......... | G02B 5/0833 |
| 2019/0245122 A1* | 8/2019 | Fan | ....................... | H01L 33/507 |
| 2020/0395491 A1* | 12/2020 | Naito | ............. | H01L 31/022466 |
| 2020/0407627 A1* | 12/2020 | Zhou | ................... | C09K 11/883 |

FOREIGN PATENT DOCUMENTS

| | | |
|---|---|---|
| EP | 2782147 A1 | 9/2014 |
| JP | 2006120913 A | 5/2006 |
| JP | 2009088299 A | 4/2009 |
| JP | 2014093509 A | 5/2014 |

* cited by examiner

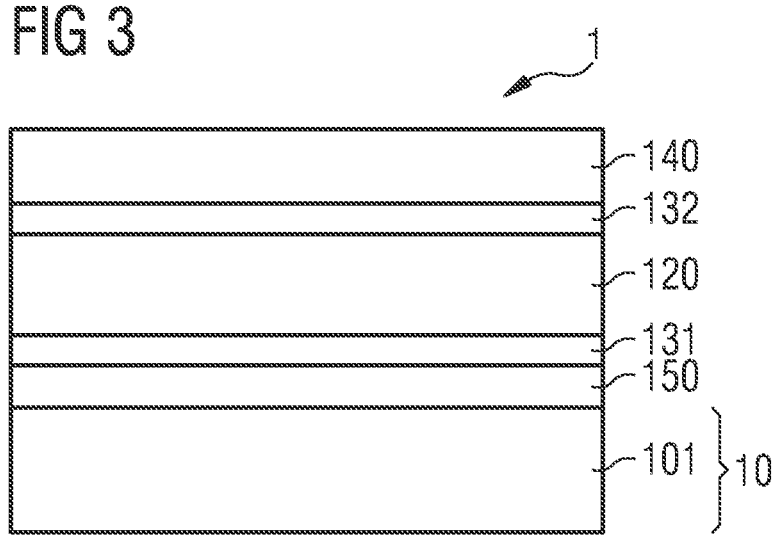
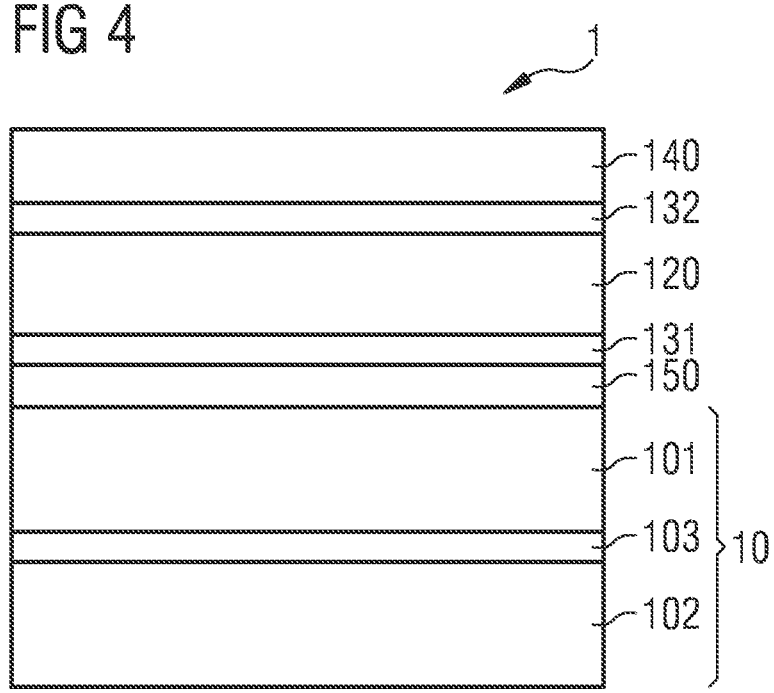

OPTOELECTRONIC SEMICONDUCTOR COMPONENT, AND METHOD FOR PRODUCING AN OPTOELECTRONIC SEMICONDUCTOR COMPONENT

This patent application is a national phase filing under section 371 of PCT/EP2019/051765, filed Jan. 24, 2019, which claims the priority of German patent application 102018101700.6, filed Jan. 25, 2018, each of which is incorporated herein by reference in its entirety.

TECHNICAL FIELD

An optoelectronic semiconductor component and a method for producing an optoelectronic semiconductor component are provided. The optoelectronic semiconductor component may, in particular, be a radiation-emitting or radiation-detecting optoelectronic semiconductor component which emits or detects electromagnetic radiation, for example light, during operation.

SUMMARY

Embodiments provide an optoelectronic semiconductor component which has an improved durability.

Further embodiments provide a method for producing an optoelectronic semiconductor component which allows a simplified production.

According to at least one embodiment of the optoelectronic semiconductor component, the optoelectronic semiconductor component comprises a semiconductor layer sequence with a first region of a first conductivity type, a reflection layer, a passivation layer, a first barrier layer and/or a second barrier layer. The passivation layer is arranged between the semiconductor layer sequence and the reflection layer. The first barrier layer is arranged between the first region of the semiconductor layer sequence and the passivation layer and the second barrier layer is arranged between the passivation layer and the reflection layer. Preferably the semiconductor layer sequence comprises a plurality of epitaxially grown semiconductor layers. The first region has a first conductivity type which is produced in particular by means of doping with foreign atoms.

The reflection layer comprises, for example, a metal layer of a precious metal and/or a precious metal alloy and has, in particular, a high reflectivity for electromagnetic radiation emitted or detected by the optoelectronic semiconductor component during operation.

The passivation layer is preferably electrically insulating and optically permeable. It serves in particular as a mirror layer, preferably by utilizing total internal reflection at its interfaces. Furthermore, the passivation layer can also be designed as a multilayer in the form of a Bragg reflector. A multilayer may in particular comprise a plurality of layers of different composition. A Bragg reflector has an alternating sequence of individual dielectric layers of different refractive indices, whose layer thicknesses are matched to the wavelength range of the radiation to be reflected. In addition, the passivation layer can protect other semiconductor layers from external environmental influences.

The first barrier layer and the second barrier layer are in particular diffusion protection layers that reduce or prevent the diffusion of contaminants. The first barrier layer, for example, protects the semiconductor layer sequence in particular against the contaminants from the passivation layer in order to reduce or prevent undesired passivation of the doping of the semiconductor layer sequence. The second barrier layer protects in particular the material arranged in the reflection layer, for example, against the contaminants accumulated in the passivation layer. Thus undesired reactions, which would result for example in bulges or detachments within the reflection layer, can be reduced or prevented.

During the production of the passivation layer, process gases such as $H_2$, $N_2$, $NO_2$, $NH_3$, $O_2$, $H_2O$ can contaminate the passivation layer. These contaminants can diffuse into surrounding semiconductor layers at a later stage of the production process or even during operation of the component and thus cause undesired effects. For example, dopant atoms introduced into other layers can be unintentionally passivated or bulges of layers can be caused by undesired chemical reactions. The first barrier layer reduces or prevents this diffusion process and thus also the associated negative consequences for the surrounding layers.

According to at least one embodiment of the optoelectronic semiconductor component, the optoelectronic semiconductor component comprises a semiconductor layer sequence with a first region of a first conductivity type, a reflection layer, a passivation layer arranged between the semiconductor layer sequence and the reflection layer, a first barrier layer arranged between the first region of the semiconductor layer sequence and the passivation layer, and/or a second barrier layer arranged between the passivation layer and the reflection layer, wherein the first barrier layer reduces or prevents a diffusion of contaminants from the passivation layer into the semiconductor layer sequence, and wherein the second barrier layer reduces or prevents a diffusion of contaminants from the passivation layer into the reflection layer.

An optoelectronic semiconductor component described here is based on the following considerations, among others. In the production of optoelectronic semiconductor components it is often necessary to carry out high-temperature annealing steps. These annealing steps are used to remove any contaminants, such as gases or other undesirable foreign atoms, which may have been deposited in the grown semiconductor layers during a previous process step. This prevents further contamination of the subsequent semiconductor layers and reduces or prevents undesirable effects caused by the contaminants, such as rapid aging, fluctuations in the forward voltage or fluctuations in the luminous flux. However, the described annealing steps for optoelectronic semiconductor components can represent an additional load, e.g., due to thermally induced tensions, or favor an undesired diffusion of elements in the semiconductor component. Furthermore, oxidation of a metallic mirror layer can also be caused by a annealing step, which reduces the reflectivity of the mirror layer.

The optoelectronic semiconductor component described here makes use, among other things, of the idea of introducing one or more barrier layers between the sensitive semiconductor layers and the layers contaminated with the contaminants. This reduces or prevents the diffusion of contaminants into the semiconductor layers. It is thus advantageous to avoid the removal of contaminants by a high-temperature annealing step.

According to at least one embodiment of the optoelectronic semiconductor component, the first barrier layer is arranged between the first region of the semiconductor layer sequence and the passivation layer, and the second barrier layer is arranged between the reflection layer and the passivation layer. In other words, the optoelectronic semiconductor component comprises both the first barrier layer and the second barrier layer. Thus, both the passivation layer and the reflection layer are protected against diffusion of any contamination from the semiconductor layer sequence.

According to at least one embodiment of the optoelectronic semiconductor component, the first and/or the second barrier layer reduces or prevents the diffusion of $H_2$, $O_2$, $N_2$, $NH_3$ from the passivation layer into the first region of the semiconductor layer sequence and/or from the passivation layer into the reflection layer. These contaminants can cause undesired effects in the semiconductor layer sequence, such as undesired passivation of dopants.

According to at least one embodiment of the optoelectronic semiconductor component, the first and/or the second barrier layer have a thickness of at most 100 nm, preferably of at most 20 nm, particularly preferably of at most 10 nm. A thinner first and/or second barrier layer has advantageously less influence on the total internal reflection or the coupling of electromagnetic radiation into the reflection layer.

According to at least one embodiment of the optoelectronic semiconductor component, the first and/or second barrier layer is formed as an ALD (Atomic Layer Deposition) layer. ALD layers can be produced by an ALD deposition process in which a monolayer of atoms is deposited. The deposition of the monolayer can be achieved by depositing several submonolayers, for example by means of an organometallic precursor such as trimethylaluminum. In this process, the methyl groups prevent a complete monolayer by means of "steric hindrance" of the individual ligands and thus initially form a submonolayer. This cycle can be repeated several times until a monolayer is formed from several submonolayers. Thus, no atomic layers are stacked on top of each other, but only a monatomic layer is deposited on a surface. The advantage of such a monolayer deposition is a very good coverage and the overforming of even the smallest particles and unevenness. This results in a very dense layer, which can advantageously represent a good diffusion barrier.

According to at least one embodiment of the optoelectronic semiconductor component, the first and/or the second barrier layer contains at least one of the compounds $Al_2O_3$, AlN or $Ta_2O_5$ or is formed from at least one of the compounds $Al_2O_3$, AlN or $Ta_2O_5$. These compounds are particularly suitable due to their good depositing properties in an ALD process and their low optical absorption. Likewise, improved adhesion of the reflection layer to the passivation layer and of the transparent, conductive layer to the passivation layer can be advantageously achieved.

According to at least one embodiment of the optoelectronic semiconductor component, the passivation layer contains or consists of at least one of the following materials: silicon oxide, niobium oxide, titanium oxide and/or magnesium fluoride. Advantageously, these materials have a very low optical absorption in a visible spectral range, are at the same time electrically insulating and easy to produce.

According to at least one embodiment of the optoelectronic semiconductor component, the passivation layer is designed as a multilayer containing at least two of the materials mentioned in the previous paragraph. In particular, the passivation layer may also be designed as a distributed Bragg reflector (DBR). With such a passivation layer designed as a Bragg reflector, an advantageously high reflectivity is achieved.

According to at least one embodiment of the optoelectronic semiconductor component, at least one layer of the optoelectronic semiconductor component is based on a phosphide compound semiconductor material and/or a nitride compound semiconductor material and/or an arsenide compound semiconductor material.

"Based on phosphide compound semiconductor material" in this context means that the semiconductor layer sequence or at least a part thereof preferably comprises $Al_nGa_mIn_{1-n-m}P$ or $As_nGa_mIn_{1-n-m}P$, wherein $0 \le n \le 1$, $0 \le m \le 1$ and $n+m \le 1$. This material does not necessarily have to have a mathematically exact composition according to the above formula. Rather, it may comprise one or more dopants and additional components. For simplicity's sake, however, the above formula only includes the essential components of the crystal lattice (Al or As, Ga, In, P), even if these may be partially replaced by small amounts of other substances.

"Based on nitride compound semiconductor material" in this context means that the semiconductor layer sequence or at least a part thereof, preferably comprises or consists of $Al_nGa_mIn_{1-n-m}N$, where $0 \le n \le 1$, $0 \le m \le 1$ and $n+m \le 1$. This material does not necessarily have to have a mathematically exact composition according to the above formula. Rather, it may, for example, comprise one or more dopants and additional components. For simplicity's sake, however, the above formula only includes the essential components of the crystal lattice (Al, Ga, In, N), even if these may be partially replaced and/or supplemented by small amounts of other substances.

"Based on arsenide compound semiconductor material" in this context means that the semiconductor layer sequence or at least a part thereof, preferably comprises $Al_nGa_mIn_{1-n-m}As$, where $0 \le n \le 1$, $0 \le m \le 1$ and $n+m \le 1$. This material does not necessarily have to have a mathematically exact composition according to the above formula. Rather, it may comprise one or more dopants and additional components. For simplicity's sake, however, the above formula only includes the essential components of the crystal lattice (Al or As, Ga, In), even if these may be partially replaced by small amounts of other substances.

According to at least one embodiment of the optoelectronic semiconductor component, the first conductivity type is p-type and preferably formed by p-doping with magnesium. Alternatively, the p-doping can also be formed with zinc or carbon.

According to at least one embodiment of the optoelectronic semiconductor component, a transparent conductive layer is arranged between the passivation layer and the first region, preferably between the first barrier layer and the first region. A transparent, conductive layer can be formed as an indium tin oxide layer, for example. The transparent, conductive layer serves for homogeneous current distribution, especially when using a semiconductor material such as InGaN, for example, whose transversal conductivity is not sufficient for this purpose.

According to at least one embodiment of the optoelectronic semiconductor component, the reflection layer comprises a transparent, conductive layer in combination with a gold layer or a transparent, conductive layer in combination with a silver layer. The transparent conductive layer in combination with a gold layer can in particular improve the adhesion of the reflection layer to the passivation layer. The second barrier layer can also improve the adhesion between a gold layer and the passivation layer. In other words, the second barrier layer can advantageously replace the transparent, conductive layer between a gold or silver layer as reflection layer and the passivation layer. In this context, a gold layer is understood to be a layer containing gold, formed with gold or consisting of gold. Accordingly, a silver layer is understood to be a layer containing silver, formed with silver or consisting of silver.

According to at least one embodiment of the optoelectronic semiconductor component, the semiconductor layer sequence has a second region of a second conductivity type on a side facing away from the passivation layer. Between the first region and the second region an active region is formed, which is arranged to emit or detect electromagnetic radiation. The active region preferably comprises a pn junction, a double heterostructure, a single quantum well (SQW) or, particularly preferably, a multi quantum well (MQW) structure for radiation generation or detection. The second conductivity type is in particular different from the first conductivity type and is formed, for example, with n-doping, in particular by means of phosphorus.

According to at least one embodiment of the optoelectronic semiconductor component, the first and/or the second barrier layer are designed to be permeable, in particular transparent or translucent, for the electromagnetic radiation emitted or detected from the active region during operation.

A method for producing an optoelectronic semiconductor component is further specified. In particular, the method can be used to produce an optoelectronic semiconductor component described here. This means that all features disclosed for the optoelectronic semiconductor component are disclosed for the method and vice versa.

According to at least one embodiment of the method for producing an optoelectronic semiconductor component, a semiconductor layer sequence with a first region of a first conductivity type is first provided in a step A).

This is followed in a step B) by the deposition of a passivation layer by means of PVD or PECVD on the first region. PVD (physical vapor deposition) is a deposition method in which the starting material to be deposited is transferred to the gas phase by means of physical processes. The material then condenses on the surface to be coated. The term PECVD (plasma-enhanced chemical vapor deposition) describes a deposition process in which the chemical deposition of substances is supported by a plasma. In both processes, process gases or other contaminants in the process chamber can adversely affect the deposited layers. Advantageously high growth rates at relatively low temperatures can be achieved.

This is followed in a step C) by arranging a reflection layer on the side of the passivation layer facing away from the first region. The reflection layer comprises, for example, a transparent, conductive oxide and a metal layer which in particular comprises a precious metal and/or a precious metal alloy. The reflection layer has a high reflectivity for electromagnetic radiation.

Between step A) and step B) a first barrier layer is formed between the first region and the passivation layer and/or between step B) and step C) a second barrier layer is formed between the passivation layer and the reflection layer. The first barrier layer and the second barrier layer can be applied by sputtering or an ALD process, for example. Sputtering is more cost efficient, while the layers produced by the ALD process are advantageously better at overmoulding a given surface, resulting in a denser layer.

According to at least one embodiment of the method for producing an optoelectronic semiconductor component, the method is free of annealing steps. An annealing step comprises a temperature treatment of the optoelectronic semiconductor component, in which, for example, the temperature is increased to 400° C. to 450° C. This is intended to expel unwanted contaminants from the semiconductor layer sequence and the passivation layer. By avoiding this annealing step, the optoelectronic semiconductor component is advantageously exposed to a lower temperature load. This results in an advantageously increased freedom in the selection of the materials to be used for the optoelectronic semiconductor component.

BRIEF DESCRIPTION OF THE DRAWINGS

Further advantages and advantageous designs and embodiments of the optoelectronic semiconductor component result from the following exemplary embodiments in connection with the exemplary embodiments shown in the figures.

FIG. 3 illustrates a schematic cross-section of an optoelectronic semiconductor component according to a fourth exemplary embodiment; and FIG. 4 illustrates a schematic cross-section of an optoelectronic semiconductor component according to a fifth exemplary embodiment.

DETAILED DESCRIPTION OF ILLUSTRATIVE EMBODIMENTS

Identical, similar or similar-acting elements are marked with the same reference signs in the figures. The figures and the proportions of the elements shown in the figures are not to be regarded as true to scale to each other. Rather, individual elements may be oversized for better representability and/or comprehensibility.

Figure 1A:
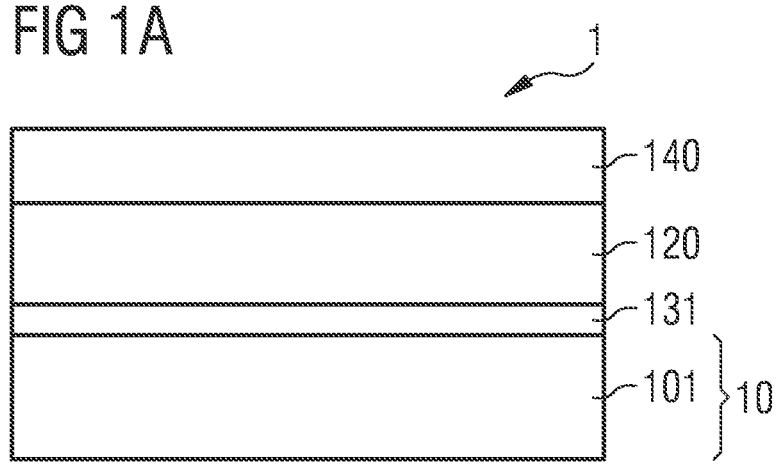
FIG. 1A shows a schematic cross-section of an optoelectronic semiconductor component according to a first exemplary embodiment.

FIG. 1A shows a first exemplary embodiment of an optoelectronic semiconductor component 1. The optoelectronic semiconductor component 1 comprises a semiconductor layer sequence 10 with a first region 101 of a first conductivity type, a passivation layer 120, a reflection layer 140 and a first barrier layer 131. The first barrier layer 131 is arranged between the passivation layer 120 and the first region 101. The reflection layer 140 is arranged on a side of the passivation layer 120 facing away from the first barrier layer 131.

The first barrier layer 131 contains for example an $Al_2O_3$ and reduces or prevents a diffusion of contaminants from the passivation layer 120 into the first region 101 of the semiconductor layer sequence 10. The first region 101 comprises for example an InGaAlP and is preferably p-doped with magnesium. The transverse conductivity of InGaAlP is sufficiently high so that a current-expanding layer of, for example, a transparent conductive oxide can be advantageously dispensed with. The reflection layer 140 comprises in particular a combination of a transparent conductive oxide with a precious metal alloy or a precious metal such as gold or silver and has a high reflectivity for electromagnetic radiation emitted or detected by the optoelectronic semiconductor component during operation.

Figure 1B:
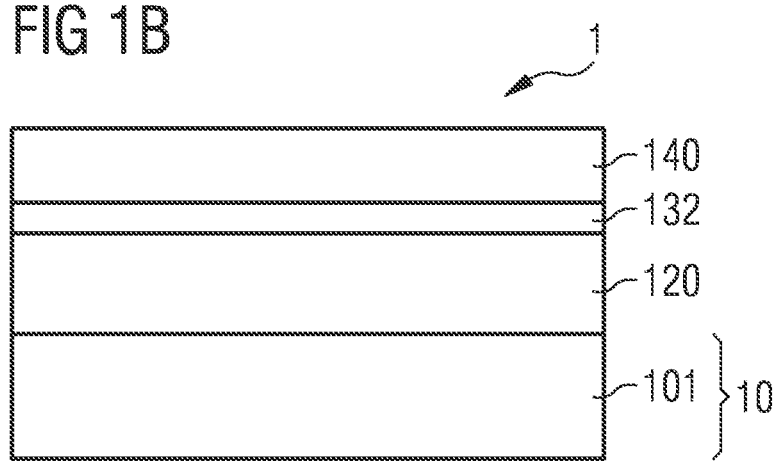
FIG. 1B shows a schematic cross-section of an optoelectronic semiconductor component according to a second exemplary embodiment.

FIG. 1B shows a second exemplary embodiment of an optoelectronic semiconductor component 1. The second exemplary embodiment essentially corresponds to the first exemplary embodiment. However, the optoelectronic semiconductor component 1 shown in FIG. 1B has a second barrier layer 132 instead of the first barrier layer 131, which is located between the passivation layer 120 and the reflection layer 140. The second barrier layer 132 reduces or prevents a diffusion of contaminants from the passivation layer 120 into the reflection layer 140. The reflection layer 140 reacts to the contaminants contained in the passivation layer 120 in particular when silver is used. This can cause bulges or undesired coloring of the reflection layer 140, which are reduced or prevented by the second barrier layer 132.

Figure 2:
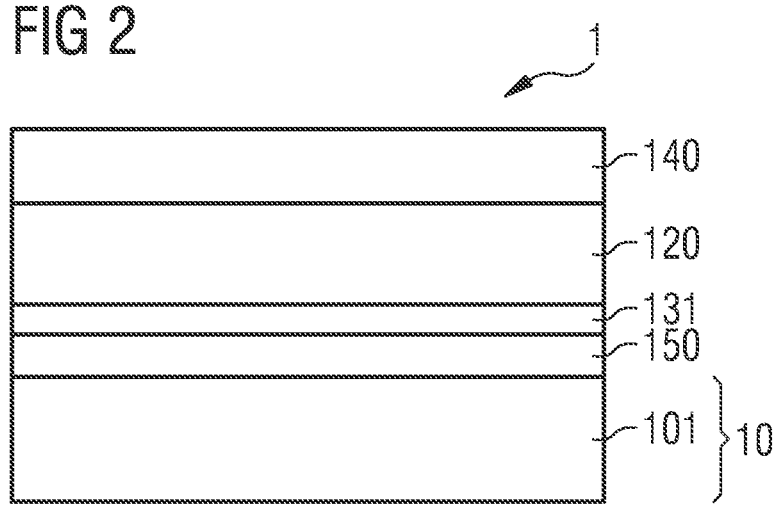
FIG. 2 illustrates a schematic cross-section of an optoelectronic semiconductor component according to a third exemplary embodiment.

FIG. 2 shows a third exemplary embodiment of an optoelectronic semiconductor component 1. The third exemplary embodiment essentially corresponds to the first exemplary embodiment and is only supplemented by a transparent conductive layer 150. The transparent conductive layer 150 is located between the first barrier layer 131 and the first region 101 and ensures a homogeneous current distribution in the first region 101. The first region 101 comprises a semiconductor material such as an InGaN and may be intended for the connection of a pn junction. Since the transverse conductivity of InGaN is not sufficiently high, the transparent conductive layer 150 ensures a laterally homogeneous current distribution.

FIG. 3 shows a fourth exemplary embodiment of an optoelectronic semiconductor component 1. The fourth exemplary embodiment essentially corresponds to the third exemplary embodiment and is additionally supplemented by a second barrier layer 132. Thus, both the reflection layer 140 and the semiconductor layer sequence 10 are advantageously protected from the effects of the contaminants in the passivation layer 120.

FIG. 4 shows a fifth exemplary embodiment of an optoelectronic semiconductor component 1. The fifth exemplary embodiment essentially corresponds to the fourth exemplary embodiment and is only supplemented by an active region 103, a second region 102 of a second conductivity type and a further transparent, conductive layer 150. The second conductivity type is different from the first conductivity type, has in particular an n-conductivity and is produced by means of phosphorus doping, for example. The active region 103 comprises, for example, a pn junction, a double heterostructure, a single quantum well (SQW) or, particularly preferred, a multi quantum well (MQW) structure for radiation generation or detection. Electromagnetic radiation generated in the active region 103 during operation can leave the optoelectronic semiconductor component 1 on the side of the second region 102 facing away from the active region 103. The reflection layer 140 reflects a part of the electromagnetic radiation and thus increases the efficiency of the semiconductor component 1. The first barrier layer 131 and the second barrier layer 132 are optically permeable and therefore do not influence the electromagnetic radiation.

The invention is not limited by the description based on the exemplary embodiments. Rather, the invention comprises any new feature as well as any combination of features, which includes in particular any combination of features in the claims, even if this feature or combination itself is not explicitly stated in the claims or exemplary embodiments.

The invention claimed is:

1. An optoelectronic semiconductor component comprising:
a semiconductor layer sequence having a first region of a first conductivity type;
a reflection layer;
a passivation layer arranged between the semiconductor layer sequence and the reflection layer;
a first barrier layer arranged between the first region of the semiconductor layer sequence and the passivation layer; and
a second barrier layer arranged between the passivation layer and the reflection layer,
wherein the first barrier layer is configured to reduce or prevent diffusion of contaminants from the passivation layer into the semiconductor layer sequence,
wherein the second barrier layer is configured to reduce or prevent diffusion of contaminants from the passivation layer into the reflection layer
wherein the first barrier layer is formed as an ALD layer, and/or wherein the second barrier layer is formed as an ALD layer, and
wherein the first barrier layer and/or the second barrier layer contain(s) at least one of $Al_2O_3$, AlN or $Ta_2O_5$.

2. The optoelectronic semiconductor component according to claim 1, wherein the first barrier layer is configured to reduce or prevent diffusion of $H_2$, $O_2$, $N_2$, $NH_3$ from the passivation layer into the first region of the semiconductor layer sequence and/or the second barrier layer is configured to reduce or prevent diffusion of $H_2$, $O_2$, $N_2$, $NH_3$ from the passivation layer into the reflection layer.

3. The optoelectronic semiconductor component according to claim 1, wherein the first barrier layer has a thickness of at most 100 nm, and/or wherein the second barrier layer has a thickness of at most 100 nm.

4. The optoelectronic semiconductor component according to claim 1, wherein the first barrier layer has a thickness of at most 10 nm, and/or wherein the second barrier layer has a thickness of at most 10 nm.

5. The optoelectronic semiconductor component according to claim 1, wherein the passivation layer contains at least a material from the group consisting of silicon oxide, niobium oxide, titanium oxide and magnesium fluoride.

6. The optoelectronic semiconductor component according to claim 1, wherein the passivation layer is formed as a multilayer containing at least two materials from the group consisting of silicon oxide, niobium oxide, titanium oxide and magnesium fluoride.

7. The optoelectronic semiconductor component according to claim 1, wherein at least one layer of the optoelectronic semiconductor component is based on a phosphide compound semiconductor material and/or a nitride compound semiconductor material and/or an arsenide compound semiconductor material.

8. The optoelectronic semiconductor component according to claim 1, wherein the first conductivity type is p-type.

9. The optoelectronic semiconductor component according to claim 8, wherein a p-dopant of the first conductivity type is magnesium.

10. The optoelectronic semiconductor component according to claim 1, further comprising a transparent, conductive layer arranged between the passivation layer and the first region.

11. The optoelectronic semiconductor component according to claim 1, wherein the reflection layer comprises a transparent, conductive layer comprising a gold layer or a transparent, conductive layer comprising a silver layer.

12. The optoelectronic semiconductor component according to claim 1, wherein the semiconductor layer sequence has a second region of a second conductivity type on a side facing away from the passivation layer and an active region formed between the first region and the second region, the active region configured to emit or detect electromagnetic radiation.

13. The optoelectronic semiconductor component according to claim 12, wherein the first barrier layer and/or the second barrier layer is/are designed to be permeable.

14. The optoelectronic semiconductor component according to claim 12, wherein the first barrier layer and/or the second barrier layer are is/designed to be transparent or translucent for the electromagnetic radiation.

15. A method for producing an optoelectronic semiconductor component comprising, the method comprising:
providing a semiconductor layer sequence with a first region of a first conductivity type;
depositing a passivation layer on the first region by PECVD or PVD; and
arranging a reflection layer on a side of the passivation layer facing away from the first region,
wherein, between providing the semiconductor layer sequence and depositing the passivation layer, a first barrier layer is formed between the first region and the passivation layer,
wherein, between depositing the passivation layer and arranging the reflection layer, a second barrier layer is formed between the passivation layer and the reflection layer,
wherein the first barrier layer is formed as an ALD layer, and/or wherein the second barrier layer is formed as an ALD layer, and
wherein the first barrier layer and/or the second barrier layer contain(s) at least one of $Al_2O_3$, AlN or $Ta_2O_5$.

16. The method according to claim 15, wherein the method does not comprise annealing.

* * * * *